(12) United States Patent
Cannon

(10) Patent No.: US 7,354,289 B2
(45) Date of Patent: Apr. 8, 2008

(54) POSITIVE LOCKING PUSH-ON PRECISION 3.5 MM OR 2.4 MM CONNECTOR FOR AN OSCILLOSCOPE PROBE

(75) Inventor: James E. Cannon, Black Forrest, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/442,814

(22) Filed: May 30, 2006

(65) Prior Publication Data

US 2007/0281532 A1    Dec. 6, 2007

(51) Int. Cl.
*H01R 13/62* (2006.01)
(52) U.S. Cl. ...................................... 439/314
(58) Field of Classification Search ................ 439/314, 439/318, 332, 317, 320, 352
See application file for complete search history.

(56) References Cited

U.S. PATENT DOCUMENTS

| | | | | |
|---|---|---|---|---|
| 4,846,731 A | * | 7/1989 | Alwine | 439/651 |
| 5,660,567 A | * | 8/1997 | Nierlich et al. | 439/620.21 |
| 5,785,545 A | * | 7/1998 | Holt | 439/352 |
| 5,857,866 A | * | 1/1999 | Felps | 439/289 |
| 6,095,841 A | * | 8/2000 | Felps | 439/312 |
| 6,379,183 B1 | * | 4/2002 | Ayres et al. | 439/578 |
| 6,402,565 B1 | * | 6/2002 | Pooley et al. | 439/680 |
| 6,468,100 B1 | * | 10/2002 | Meyer et al. | 439/320 |
| 6,602,093 B1 | * | 8/2003 | Cannon | 439/578 |
| 6,609,925 B1 | * | 8/2003 | Cannon | 439/332 |
| 6,619,876 B2 | * | 9/2003 | Vaitkus et al. | 403/349 |
| 6,783,382 B2 | * | 8/2004 | Felps | 439/314 |
| 6,790,080 B2 | * | 9/2004 | Cannon | 439/551 |
| 6,808,407 B1 | * | 10/2004 | Cannon | 439/314 |
| 6,884,099 B1 | * | 4/2005 | Cannon | 439/318 |
| 6,933,173 B2 | * | 8/2005 | Yunus | 438/110 |
| 7,221,245 B2 | * | 5/2007 | Tanbakuchi et al. | 333/260 |
| 2005/0113818 A1 | * | 5/2005 | Sartor et al. | 606/34 |

* cited by examiner

*Primary Examiner*—Alexander Gilman

(57) ABSTRACT

A positive locking push-on 3.5 mm (or other diameter, such as 2.4 mm) connector is provided by retaining an existing bayonet lug and latch style push-on latch mechanism and associated male and female outer conductor shells, but which is sized for 3.5 mm use, while providing SMA/APC-3.5 style male and female center conductor pins that are held in place within their respective outer conductor shells by RF beads that are part of a unitized transmission line subassembly. Alteration of certain axial dimensions of the outer conductor shells prevents the accidental mating of the 3.5 mm bayonet connector with a BNC connector of the opposite gender, and does so in a way that prevents damage to any of the center pins.

5 Claims, 5 Drawing Sheets

POSITIVE LOCKING PUSH-ON PRECISION 3.5 MM OR 2.4 MM CONNECTOR FOR AN OSCILLOSCOPE PROBE

REFERENCE TO RELATED APPLICATION

The subject matter of this Application is related to that of U.S. Pat. No. 6,884,099 B1. For brevity and the sake of completeness, U.S. Pat. No. 6,884,099 B1 (the '099 Patent) is hereby expressly incorporated herein by reference. A perusal of the '099 Patent would reveal that it incorporates U.S. Pat. No. 6,095,841.

INTRODUCTION AND BACKGROUND

The connectors that attach cables to high frequency test equipment, such as oscilloscopes, have a significant effect on the fidelity, and even the very ability, of the connection to convey the signal of interest. This arises from the customary practice of using an actual transmission line with a controlled characteristic impedance ($Z_0$), which is often 50 Ω, as the connecting medium between the test equipment and the work piece. As is well known, the characteristic impedance of a transmission line is affected by its mechanical dimensions, and the presence of a connector between two sections of a coaxial transmission line is an opportunity for unwanted changes in $Z_0$ (discontinuities) that cause reflections and impair the fidelity of the transmitted signal. Not all high frequency connectors are created equal, and it is often the case that the more conveniently manipulated connectors (e.g., BNC) are ill suited for high frequency service (standard BNC begins to 'leak' above 500 MHz, and is extremely visible as a significant discontinuity on a TDR—a Time Domain Reflectometer).

Connectors that offer suitable performance have been variously developed and adopted as commercially available 'standard' items. As service at ever higher frequencies is contemplated the physical size of the coaxial transmission line becomes an issue. While the characteristic impedance of a coaxial transmission line is determined by a ratio of diameters and an intervening dielectric constant, when the particular dimension of the diameter difference becomes a significant fraction of a wavelength the physical structure of the resulting transmission line can (simultaneously) support different modes of propagation (which is called 'moding'). These different modes (physical orientations of the electric and magnetic fields relative to the conductors of the transmission line) do not all behave the same way as they propagate, but they can interact, and the resulting mischief can be likened to an internal 'trafficjam' for the signal within the cable. Thus it is that the tendency is to employ coaxial structures of smaller diameter as bandwidth increases (to prevent moding), despite the fact that small cables are usually more lossy than their larger counterparts.

Smaller cables mean smaller connectors, which in turn are more delicate and more easily damaged than their larger counterparts. And while the larger 7 mm line of connectors (GR-874, N, APC-7) are comparable in size to the adult human finger and thumb (allowing for comfortable manipulation) and are generally usable up to 18 GHz, the trend for high frequency oscilloscopes has been to move toward the use of 3.5 mm connectors (APC-3.5, SMA) that are good up to 26 GHz, and can be foreseen to use the 2.4 mm connector. To achieve their promised performance these connectors need to be properly mated, which includes proper tightening of a small threaded nut on the male portion of the connector that draws the two connector halves together. This operation is generally regarded as being noticeably fussier than for a 7 mm counterpart.

Another issue concerning high frequency oscilloscope probes is that they are generally active probes, meaning that there is an actual powered amplifier at their 'business end' near where the probe tip is, and that not only must the front panel connection at the 'scope accommodate a 3.5 mm connector for a transmission line, but also various conductors for power, ground, and 'house-keeping' information must be dealt with. (Housekeeping information can include such things as reporting by the probe of its model number or type, and calibration information specific to that particular probe.)

Thus we arrive at the subject matter of the incorporated U.S. Pat. No. 6,884,099 B1. It deals with various aspects of a 'push-on' coaxial connector and assorted auxiliary (house keeping) connections that are housed in a probe pod. The probe pod is attached to the front panel, and all of its connections, both coaxial and auxiliary, are made by simply first aligning the pod to the front panel and then pushing the pod against the panel, followed by a short tightening movement of a locking tab (or lever) by the thumb. The probe pod is removed by an opposite motion of the thumb against the locking lever while pulling the probe pod away from the front panel. The incorporated U.S. Pat. No. 6,884,099 B1 deals with the use of a modified (precision) BNC connector in such a push-on probe pod. The BNC design is well suited for such a use, as the bayonet latching mechanism involves a quarter turn that can be accommodated by spring loading the BNC latch, while a locking feature is coupled to the motion imparted to the locking lever by the thumb. The housekeeping connections are made with spring-loaded 'pogo' style pins in the probe pod that press against corresponding pads on the front panel.

When considering how to extend the frequency range of the push-lock connector for a probe pod there is a choice of whether to start from scratch and design an entirely new connector, or, as with the modified precision BNC connector, to begin with an established design and adapt it to operate in the new environment. The interchangeable SMA/APC-3.5 connector specifications afford an attractive starting point. However, they rely upon several turns of a threaded nut to draw the mating parts together. We would like to have something that, as far as the operator is concerned, works or is used in the same manner as does the push lock BNC connector of probe pod of U.S. Pat. No. 6,884,099 B1, but which has the electrical performance of the APC-3.5 connector. It seems we need to combine the convenience of a BNC-style latch with the performance of 3.5 mm innards. What to do?

SIMPLIFIED DESCRIPTION

A positive locking push-on 3.5 mm (or 2.4 mm) connector is provided by retaining the bayonet latch of the BNC-style push-on latch mechanism and associated male and female outer conductor shells, but which is sized for 3.5 mm (or 2.4 mm) use, while providing (for 3.5 mm) SMA/APC-3.5 style male and female center conductor pins that are held in place within their respective outer conductor shells by RF beads that are part of a unitized transmission line subassembly. Alteration of certain axial dimensions of the outer conductor shells prevents the accidental mating of the 3.55 mm (2.4 mm) bayonet connector with a BNC connector of the opposite gender, and does so in a way that prevents damage to any of the center pins.

DETAILED DESCRIPTION

Figure 1:
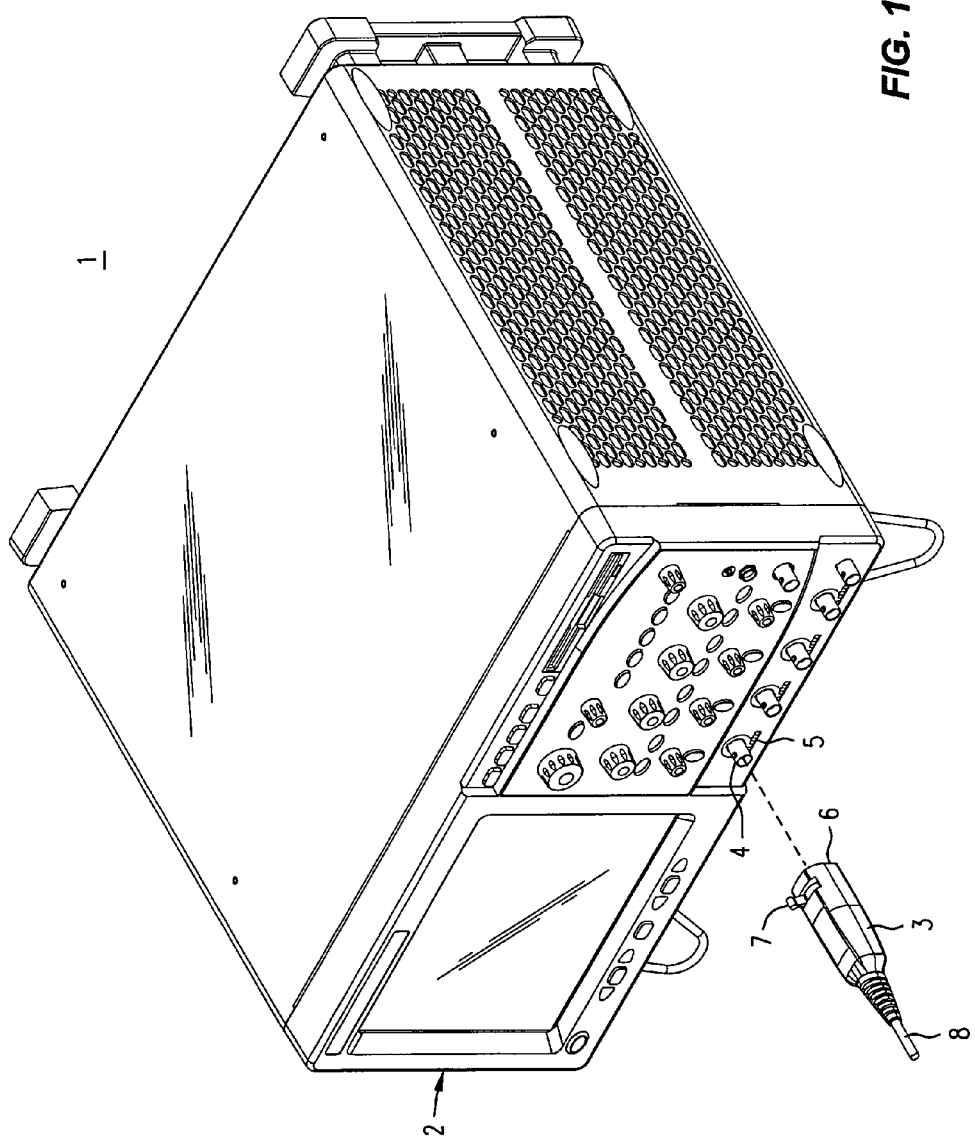
FIG. 1 is a front perspective view of an oscilloscope using a positive locking push-on 3.5 mm connector mechanism within a pod portion of an active probe that attaches to an oscilloscope.

Refer now to FIG. 1, wherein is shown a front perspective view 1 of an electronic instrument 2, such as a digital oscilloscope, having one or more front panel precision female 3.5 mm bayonet latch connectors 4 that receive a positive locking push-on precision male 3.5 mm bayonet latch connector assembly 3 (probe pod housing), say, in support of operation with an active probe (not shown) connected at a distal end of a cable 8. It will be appreciated that, although our explanation will proceed for the 3.5 mm connector, what is said and shown applies equally well to the case of a 2.4 mm connector.

In a manner similar to that explained in another U.S. Pat. No. (6,095,841) that is itself incorporated in the '099 Patent incorporated herein, the positive locking push-on precision male 3.5 mm bayonet latch connector probe pod housing is installed by first lining it up and then pushing it toward the 'scope. That engages the 3.5 mm bayonet latch detents, and a simple motion with the thumb against the lever (or tab) 7 performs a positive locking that fully and forcefully mates the two 3.5 mm bayonet latch connector halves. When the pod housing 3 is locked, not only is a precision 3.5 mm bayonet latch connection established with connector 4, but a row of spring loaded pins 6 (not visible) on the front of the housing for the push-on assembly 3 engages a row 5 of contacts beneath the connector 4. To remove the positive locking push-on precision male 3.5 mm bayonet latch connector the operator pushes in the opposite direction on lever or tab 7 with a thumb or a finger, while pulling the assembly (3) away from the 'scope.

Figure 2:
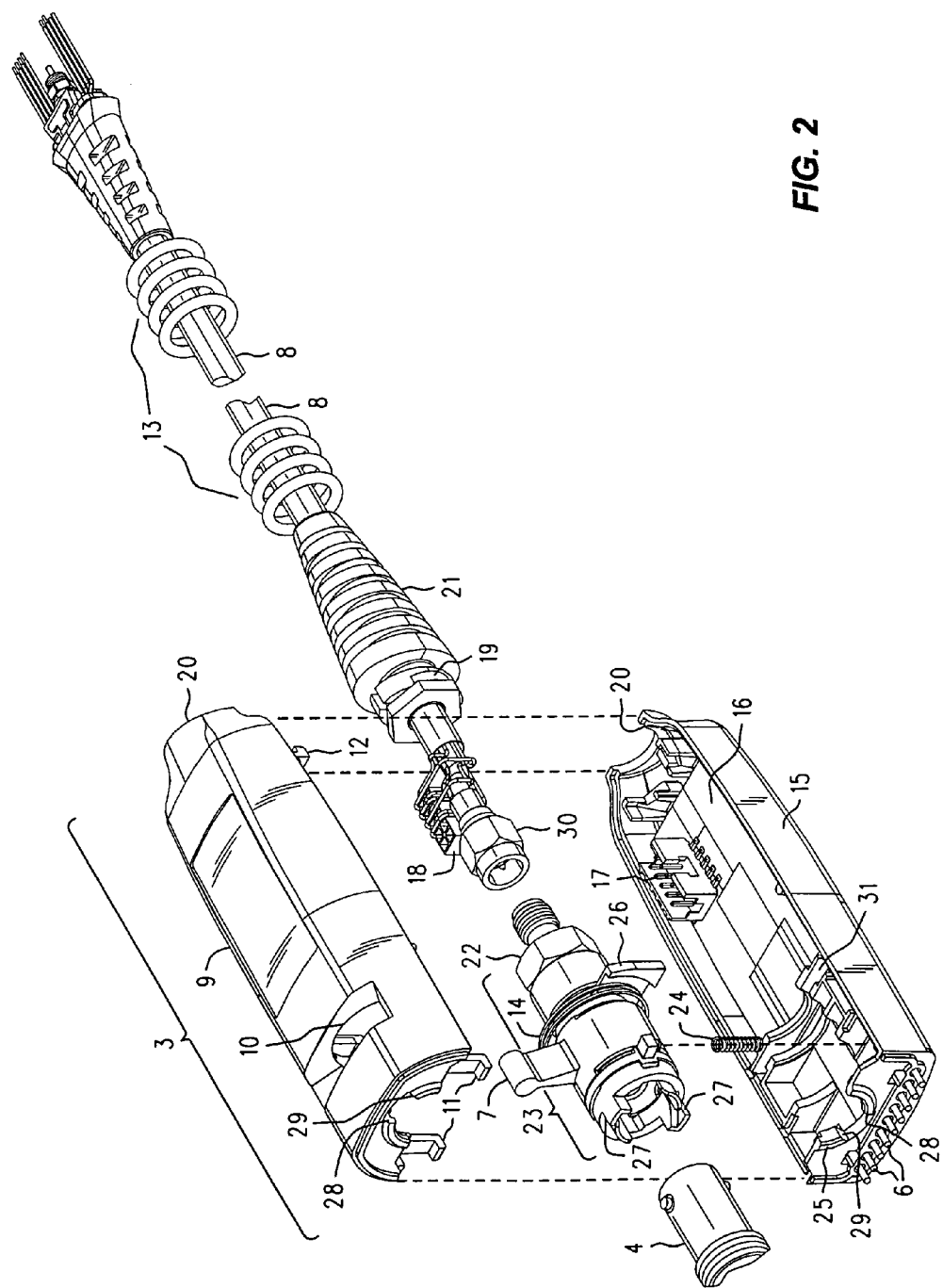
FIG. 2 is an exploded perspective view of the positive locking push-on 3.5 mm connector mechanism within the pod portion of the active probe of FIG. 1.

Refer now to FIG. 2, wherein is shown an exploded view of the housing 3 of FIG. 1 and its contents. In particular, an upper housing half 9 and a lower housing half 15 cooperate to contain a locking self-latching male 3.5 mm bayonet latch assembly 23, a female RF connector assembly 22 (e.g. using APC-3.5) for connection with a cable 8 that has an active probe at a distal end. (We have not shown the probe itself, only a boot and some conductors that attach to it.) The cable 8 connects to RF connector assembly 22 through its own male connector 30. The cable 8 is further anchored in the housing by the action of a strain relieving boot 21 that is affixed to the cable and that has a narrow neck 19 that is made captive in an aperture (20) in the rear of the housing. Also shown are two sets of flexible colored rubber rings 13 that can be passed by each other to reside upon grooves in the boots. These colored rings serve as reconfigurable probe identifiers.

Besides the coaxial transmission line in the cable 8, there are six to eight other conductors that are part of cable 8, and these are connected to a circuit board 16 in housing half 15 through connectors 18 and 17. The function of these six to eight conductors varies with the model of the probe, and is connected with the function of the row of spring loaded pins 6. Besides power, power return and bias voltages, there are also items of information that are passed by these conductors, such as model numbers, calibration information and serial numbers.

The positive locking self-latching male 3.5 mm bayonet latch assembly 23 is held in place by a pair of wings 26 (only one of which is visible in FIG. 2) that become captive in a slot 31 in the lower housing half 15. A similar slot (not visible) exists in the upper housing-half 9. These slots are sized to contain the wings 26 with essentially no remaining free motion. Note the front aperture 25. A front portion of the locking self-latching 3.5 mm bayonet latch assembly 23 (the dogs or prongs having surfaces 27) extends into the aperture 25. The aperture 25 adds some support to the locking self-latching 3.5 mm bayonet latch assembly 23 while allowing it to rotate. The rotation will arise from action during mating, or from some combination of force from spring 24, spring 14 or the movement of lever 7. The amount of rotation is limited by diameter changes in the aperture at surfaces (or steps) 28 and 29. For example, surface 27 on the locking self-latching 3.5 mm bayonet latch assembly 23 stops against step 28, and establishes an idle, or "ready to mate," orientation of the locking self-latching 3.5 mm bayonet latch assembly 23. Step 29 limits rotation in the other rotational direction during locking, and generally is reached only when the locking motion for lever 7 is performed without a female 3.5 mm bayonet latch connector (4) having already been latched.

To conclude our description of FIG. 2, note the slot 10 in the upper housing half 9. It allows the lever 7 to extend outside the housing so that it can be actuated by the operator. And finally, note also the hooks 12 and flexible catches 11. Hooks 12 of the upper housing half 9 act as hinges, and engage suitable corresponding recesses (not shown) in the lower housing half 15. Flexible latches 11 of the upper housing engage recessed stepped apertures (not shown) in the bottom of the lower housing half, and snap forward over the steps to hold the two housing halves together. To separate the housing halves, a suitable tool (e.g., the jaws of an open pair of dainty long nose pliers, or the points of a pair of draftsman's dividers) is inserted into the recessed stepped apertures and pressure is applied to move the angled portions of the flexible catches 11 away from the steps. Then the housing halves 9 and 15 are unhinged and separated.

Finally, it will be appreciated that the aperture 25, wings 26 and their slots 31, all combine to hold the locking and self-latching 3.5 mm bayonet latch assembly 23 securely in place within the housing 3, even though parts of it are free to rotate.

Figure 3:
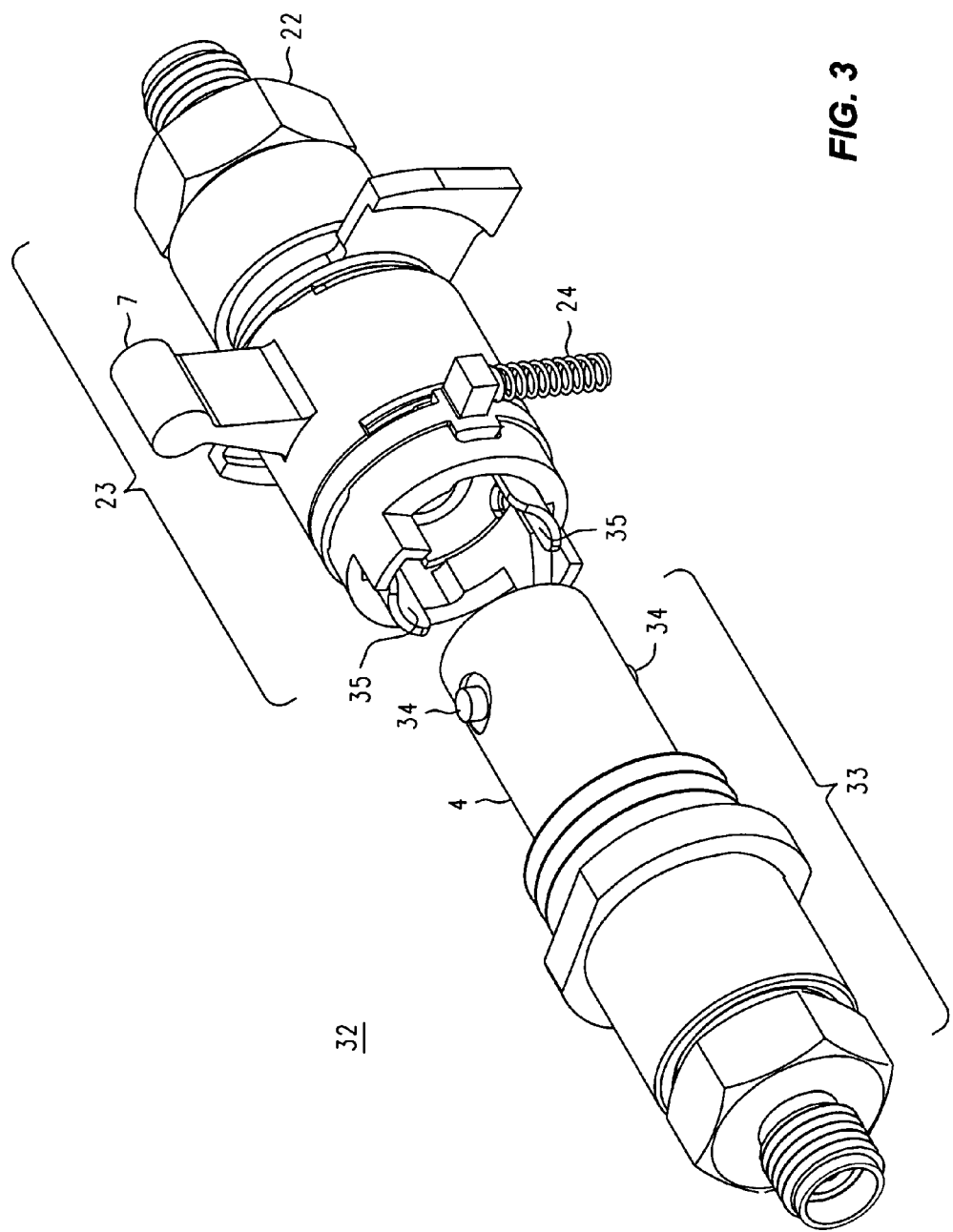
FIG. 3 is a perspective view, in isolation, of the male and female portions of a mating pair of push-on 3.5 mm connectors of FIG. 2.

With reference now to FIG. 3, a further explanation of how the positive locking self-latching aspects of the 3.5 mm male bayonet latch assembly 23 and female 3.5 mm connector 4 operate would be the same as for the BNC counterparts described in the incorporated '099 Patent. There is a quite detailed explanation that may be found in connection with FIGS. 3-5 in that '099 Patent, and it need not be repeated in great detail here. Our present interest concerns interior transmission line aspects of the 3.5 mm male bayonet latch assembly 23 and female 3.5 mm connector 4. Accordingly, we offer only an 'adjusted' version of those mechanical operations, which we have robbed from the SUMMARY OF THE INVENTION set out in the '099 Patent and then modified and annotated to match our present Figures. To with:

A housing (15, 9) carries a male push-on precision 3.5 mm connector (23). The push-on latching function (the engaging in detents of the bayonet pins (34) on a female 3.5 mm bayonet connector (4, 33)) of the male bayonet latch (27) carried in the housing, and the positive locking of mated male and female connectors, are performed by three cooperating parts located within the housing:

The first is a male double shell assembly (56) having two male sleeves (51, 57) on a common axis and separated by an annular space (59) large enough to receive an intervening outer shell (49) of a 3.5 mm female bayonet connector (33). The double shell is carried in a fixed position within the housing, and also has provision for carrying an electromechanical transition (22, 30) to a cable 8 that runs from the housing to the probe (not shown). An outer portion near the middle of the male double shell carries several turns of an exterior left-hand thread.

The second of the three cooperating parts is a self-latching 3.5 mm latch (27) having an interior bore by which it snugly yet easily engages, and is then carried upon, the exterior of the male double shell. It rotates easily thereabout. One end of the self-latching 3.5 mm latch has ramps and detents for engaging the bayonet pins (34) of a 3.5 mm female bayonet connector(33), and the other end has a section of exterior right-hand threads. The section of exterior right-hand threads is proximate the exterior left-hand threads of the male double shell.

The third cooperating part is a double-acting barrel (58) that has a bore therethrough with both left and right hand internal threads. The double-acting barrel engages and bridges the exterior threads of the self-latching 3.5 mm latch and the male double shell. Similar to a turnbuckle, rotation of the double-acting barrel will, when rotated in one direction, cause the self-latching 3.5 mm latch to move toward the male double shell, and cause it to move away when the rotation is in the opposite direction. When the self-latching 3.5 mm latch has bayonet pins (34) in its detents (i.e., male and female 3.5 mm bayonet connectors are mated) and moves toward the male double shell, the detent mechanism pulls the entire probe pod assembly toward the (presumably immovable) female 3.5 mm bayonet connector (on the front panel of an instrument such as an oscilloscope). After less than 90° of barrel rotation the front surface of the inner male shell bottoms out inside a complementary shoulder of the female shell, while simultaneously the center conductors engage fully. At this point the two connector halves are now positively locked together along the axial direction.

The double-acting barrel has a thumb lever (7) that extends through a slot in the pod housing so that the operator can rotate it in both directions. The bridging action of the double-acting barrel adds axial rigidity to the self-latching 3.5 mm bayonet connection, while also cooperating with a collection of rotational bias and limit mechanisms that keep the un-mated (idle) 3.5 mm bayonet latch in a correct orientation to begin the mating process, and that ensure un-mating of the detents during the unlocking of the double-acting barrel. One of these mechanisms involve a spring (24) biased and rotatablymounted double-dog that spans respective slots in the facing edges of the self-latching 3.5 mm bayonet latch and the double-acting barrel. The other mechanism involves a bias spring (24) anchored to the housing that biases an idle double-acting barrel to a ready-to-mate position.

Figure 4A:
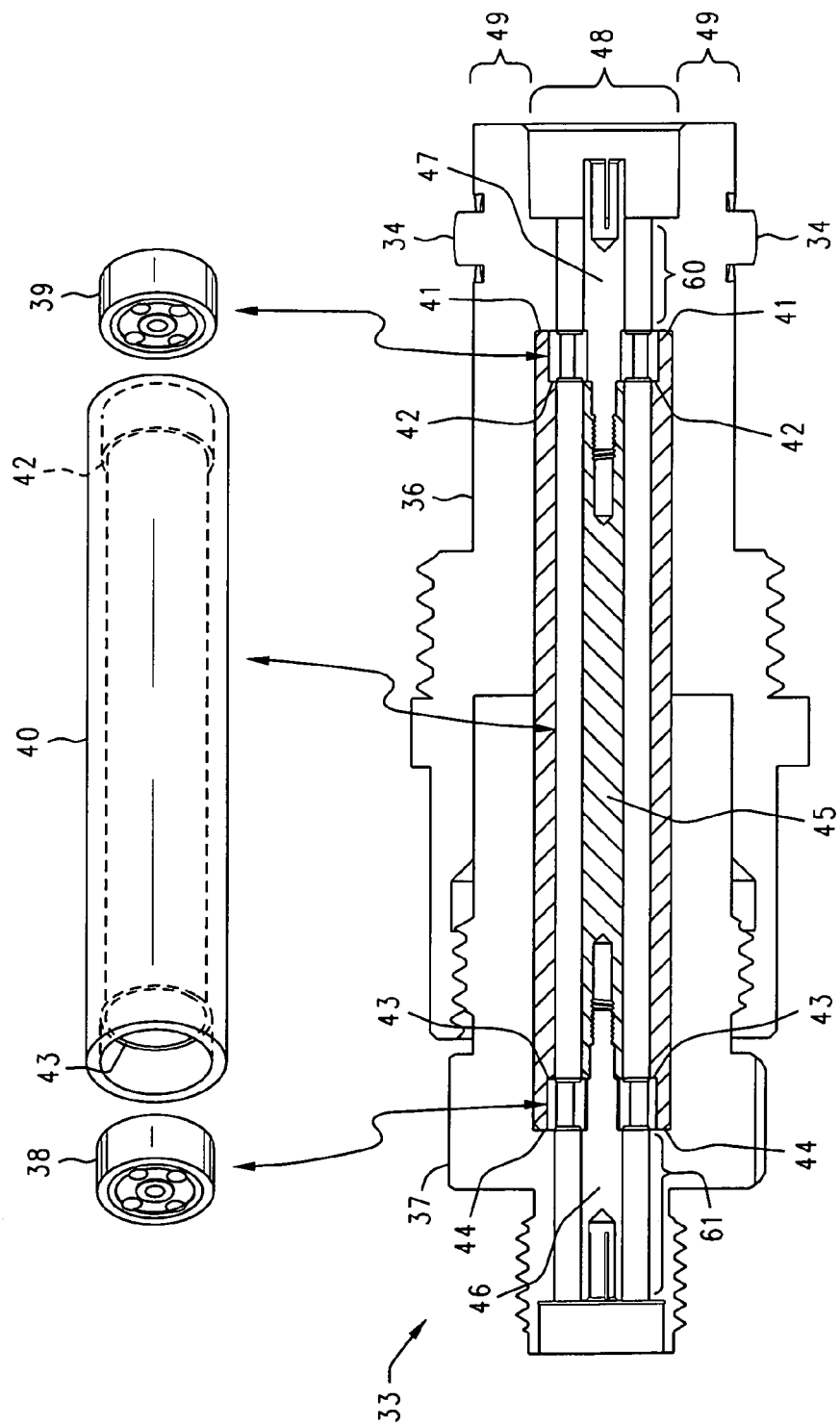
FIGS. 4A and 4B are cut-away side views of the mating pair of male and female 3.5 mm connectors of FIG. 3.

Now refer to FIG. 4A, which is a composite view of the female 3.5 mm bayonet connector (4, 33) of FIGS. 2 and 3. This is the connector assembly that will be mounted on the front panel to present a female 3.5 mm bayonet connection for the probe pod to mate with, while also providing a convenient internal RF connection to subsequent circuitry. Note that two threadably coupled shells (36, 37) have a common longitudinal bore therethrough. Each shell has a section of reduced diameter (60, 61) that produces corresponding shoulders 41 and 44. Captive within the central portion of the common bore is a transmission line subassembly formed as follows.

A connecting center rod 45 is threadably coupled to two RF connector center pins 46 and 47. For example, both 46 and 47 might be conventional center pins for either APC-3.5 or SMA service. A reduced diameter portion of each center pin passes through a central bore within a respective RF bead (38, 39) before threadably coupling to the connecting center rod 45. The diameter reductions causes a shoulder that abuts against each center pin as it seats against its corresponding RF bead, and thus prevents it from passing completely through the bead. The diameter of the connecting center rod is also larger than the central bore through the bead. Thus one RF bead is made captive between one end of the connecting center rod and the corresponding center pin, while the other RF bead is made captive between the other end of the connecting center rod and the other center pin.

Furthermore, a (hollow) cylindrical sleeve 40 has shoulders 42 and 43 that are formed of a slight internal diameter reduction for the central portion of the cylindrical sleeve 40, and which serve to seat the RF beads at a distance apart that matches the length of the connecting center rod 45. When thus assembled, the inside surface of the cylindrical sleeve and the outside surface of the connecting center rod 45 form a rigid coaxial transmission line of a selected (say, 50 Ω) characteristic impedance that is of a length equal to the distance from the outside of one RF bead to the outside of the other.

Note that other characteristic impedances might be employed. We mention 50 Ω since it is very commonly used in this type of active probe application for an oscilloscope. Notice also how the continuous nature of the cylindrical sleeve conceals any effect that the threaded joint between the two bores in shells 36 and 37 might otherwise produce. Say, for example, the two bores were not of the exact same diameter, or were slightly eccentric for not having a truly common axis. Either of these would constitute a discontinuity within the transmission line, and cause unwanted reflections that would degrade the performance of the measurement system of which the probe pod is a part. Furthermore, the resulting unit transmission line subassembly is easily handled, separately tested ahead of time, and then installed within the bores of the two shells before they are screwed together: the unit (transmission line) subassembly stays put together and does not come apart to cause a tricky assembly procedure while assembling the rest of the 3.5 mm bayonet connector.

In this connection, it may be desirable for the threads at one end of the connecting center rod and the corresponding center pin to be of a first handedness (left or right), while those at the other are of the other. Also, the threads joining the center pins to the connecting center rod may be locked with a suitable conductive thread locking compound.

We found it convenient in this project to use existing 3.5 mm connector components, such as center pin designs (or minor modifications thereto, such as a length) and already developed RF beads intended for use with those center pins. These RF beads are designed to preserve the desired characteristic impedance despite necessary diameter changes that create the mechanical interference that allows things to stay assembled in proper relation to one another. So, for example, the RF beads we used here are of Noryl, which is a specialty plastic having a suitable dielectric constant and other properties suitable for use in a microwave environment. These RF beads of Noryl plastic are made by Agilent Technologies using Noryl plastic available from the General Electric Company. Noryl is a trademark of the General Electric Corporation.

To conclude our discussion of FIG. 4A, note that the RF connector formed on shell 37 and using center conductor pin 46 might be of any convenient type. In the example shown in FIG. 4A it is an APC-3.5 connector. The other connector, however, (formed on shell 36 and using center pin 47) is particular to mating with the positive locking push-on precision 3.5 mm connector shown in FIG. 4B. To that end, it has, as previously mentioned, a pair of bayonet lugs 34 disposed upon an outer shell. In fact, it looks suspiciously like a female BNC connector, even though it is not.

This resemblance to BNC is not intentional, but is understandable. Given the concerns about moding, it ought not be larger than necessary, and front panel space is generally at a premium. On the other hand it has to support the probe pod (3) and resist any bending moment and accidental jerking on the cable (8). So it turns out that the general size of a female BNC connector is about the right size for the female 3.5 mm bayonet connector (4, 33).

To compound the situation, an earlier line of digital sampling oscilloscope products from Agilent Technologies, and out of which arose the incorporated '099 Patent, actually uses the BNC form factor for a precision BNC connection between the probe pod and the 'scope.

These circumstances combine to permit the possibility of confusion, especially when a mixture of equipment of different vintages is in use at the same location. What happens if your buddy Charlie grabs a similar looking probe and tries to jam its probe pod onto a 'scope of the wrong connector style? Clearly, we owe it to the customers who buy and use our products to "idiot proof" the 3.5 mm bayonet connectors we have been describing, so that an innocent oversight does not ruin or damage the connectors of an expensive assembly.

To that end, we have arranged that the 3.5 mm bayonet connector will not, despite its outward resemblance thereto, mate with BNC connectors of the opposite gender. To conclude our discussion of FIG. 4A we now point out how this is accomplished for the female 3.5 mm bayonet connector (4, 33) shown in FIGS. 2, 3 and 4A.

Here are two ways that the female 3.5 mm bayonet connector can be prevented from mating with a male BNC connector. First, the diameter 48 can be too small to permit the outer shell of a male BNC connector to enter. Second, recall that in the BNC male connector there is an annular gap between outside of the outer shell and the inside of the BNC bayonet latch. In a normal BNC connection that gap is filled with an outer shell from the female BNC connector as the bayonet lugs engage the bayonet latch. For a 3.5 mm bayonet connector (4, 33) the thickness 49 of its annular outer shell can be made too large to permit it to enter the annular gap on the male BNC connector. Either one or both of these techniques may be used to prevent a male BNC connector from mating with the female 3.5 mm bayonet connector (4, 33).

Figure 4B:
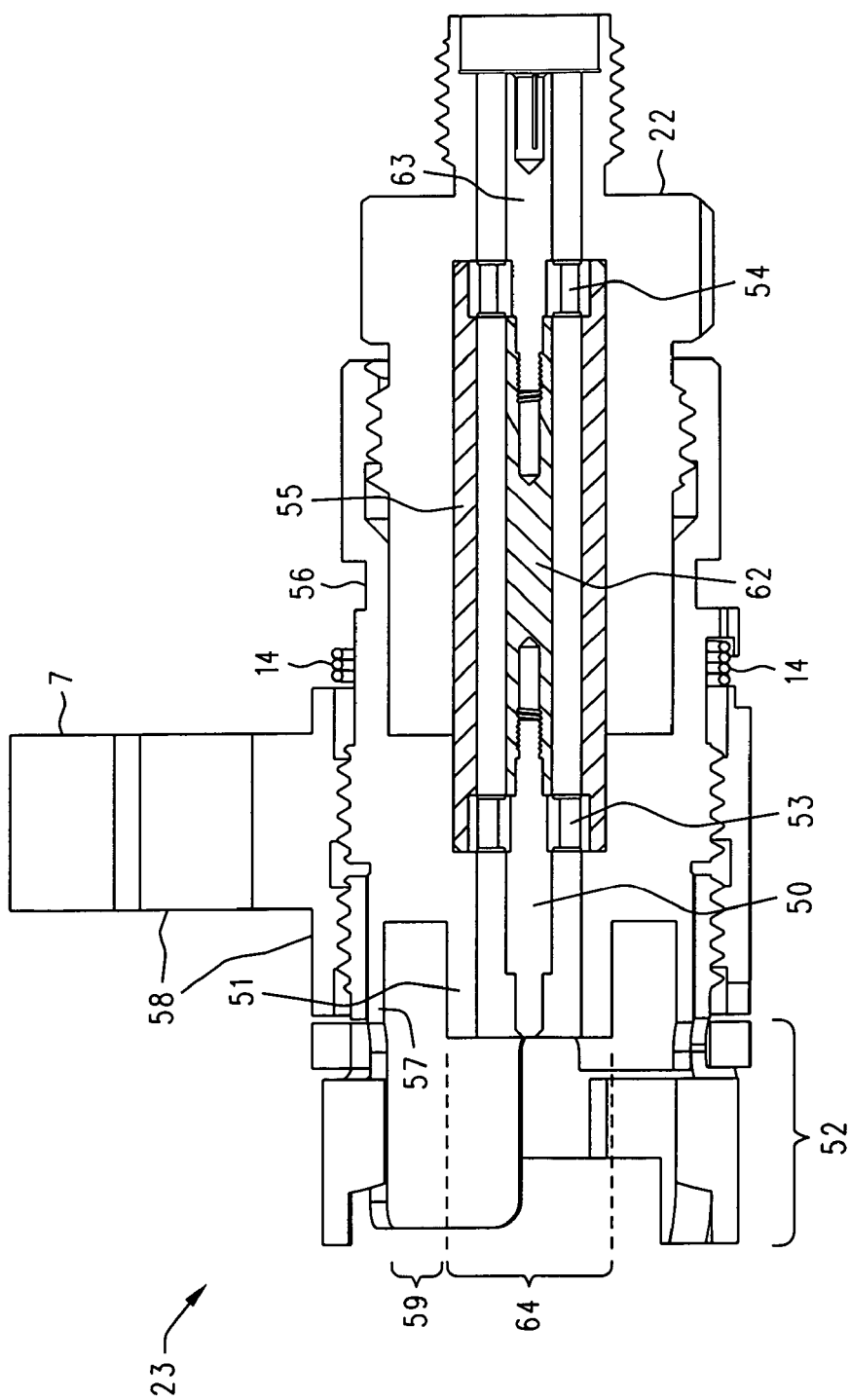

Now refer to FIG. 4B, wherein is shown a cut-away side view of the male 3.5 mm bayonet connector 23 that is carried within the probe pod 3. Its self-latching and positive locking aspects have already been dealt with, and it will be readily apparent from an inspection of FIG. 4B that cylindrical sleeve 55, RF beads 53 and 54, center pins 50 and 63, and connecting center rod 62 all comprise a unit transmission line subassembly located inside two shells (56, 22) each having a bore therethrough, which is similar to what appears in, and was described for, FIG. 4A. It will be appreciated that the RF connector formed by shell 22 and center pin 63 may be of any convenient style. What is shown is a female APC-3.5 connector.

To conclude, then, we now point out how the male 3.5 mm bayonet connector 23 can be "idiot proofed" to prevent it from incurring damage during an attempt to mate it with a female BNC connector. There are three ways, First, note the recess amount 52. It can be made sufficiently large that, even if other things do not prevent partial mating, complete mating will not occur because the bayonet lugs on the female part will not advance far enough into the male bayonet latch to overcome the distance 52 and allow the two center pins to come into contact. Second, note distance 59. This refers to the thickness of an annular gap that in BNC practice accepts the outer shell and bayonet lugs of the female connector. This annular gap 59 can be made too small to permit the entry of that female outer shell. Third, note diameter 64. It can be made too large to permit it to enter the inside of the outer shell of the female BNC connector.

Finally, it will appreciated that the subject matter described here could be used to create a positive push-on precision connector for other bore diameters, as well. For example, it could be used to make such a 2.4 mm connector.

I claim:

1. A female bayonet connector comprising:
   a first shell having first and second ends and also having a first bore therethrough;
   a plurality of bayonet lugs disposed upon an outer surface of the first shell and proximate the first end thereof;
   a second shell having third and fourth ends, coupled at the third end to the second end of the first shell, and having a second bore therethrough that is coaxial with the first bore;
   the first bore having a first region of diameter reduction creating a first shoulder, the first region of diameter reduction proximate, but a first selected distance from, the first end, and the first region of diameter reduction being between the first shoulder and the first end;
   the second bore having a second region of diameter reduction creating a second shoulder, the second region of diameter reduction proximate, but a first selected distance from, the fourth end, and the second region of diameter reduction being between the second shoulder and the fourth end;
   first and second RF beads each of circular cross section and each having parallel end surfaces the thickness of the RF bead apart, each RF bead having a bore therethrough centered in the end surfaces;
   a cylindrical sleeve having an outer diameter that fits within the first and second bores and also having within a central region an inner diameter less than the diameter of the circular cross section, the cylindrical sleeve having opposing fifth and sixth ends, proximate each of which the inside diameter increases to accept the circular cross section and form respective third and fourth shoulders, the extent of the third and fourth shoulders along the axis of the cylindrical sleeve being less than or equal to the thickness of the RF beads;
   the first RF bead disposed against the third shoulder and the second RF bead disposed against the fourth shoulder;
   first and second RF connector center pins, each having a threaded reduced diameter portion depending from a diameter reduction at a shoulder and extending for a distance longer than the thickness of the RF beads, each of the first and second RF connector center pins entering the bore of a respective one of the first and second RF beads and abutting a respective one of the parallel end surfaces;

a connecting center rod of diameter greater than the bores in the RF beads and threadably coupled at each end to a respective one of the reduced diameter portions of the first and second RF connector center pins;

the inner diameter of the cylindrical sleeve and the diameter of the connecting center rod forming a coaxial transmission line of selected characteristic impedance;

the cylindrical sleeve disposed within the first and second bores, the fifth end abutting the first shoulder and the sixth end abutting the second shoulder;

a female end of the first RF connector center pin extending beyond the first region of diameter reduction in a direction toward the first end of the first shell, but remaining a selected distance inside the first bore; and the second RF connector center pin forming at the fourth end of the second shell an RF connector that mates with a selected style of RF connector.

2. A female bayonet connector as in claim 1, wherein the first bore at the first end of the first shell forms an aperture that is too small to admit the inner male shell of a male BNC connector.

3. A female bayonet connector as in claim 1, wherein the first RF connector center pin is recessed with the first bore of the first shell to an extent that it cannot contact the male center pin of a male BNC connector.

4. A female bayonet connector as in claim 1, wherein the RF connector formed by the second RF connector center pin and the fourth end of the second shell is an APC-3.5 connector.

5. A female bayonet connector as in claim 1, wherein the RF connector formed by the second RF connector center pin and the fourth end of the second shell is an SMA connector.

* * * * *